United States Patent
Murakami

(10) Patent No.: US 9,449,704 B2
(45) Date of Patent: Sep. 20, 2016

(54) FLEXIBLE CLOCK SCHEME OF FLASH MEMORY, MEMORY MODULE, COMPUTER-READABLE RECORDING MEDIUM AND OPERATING METHOD USING THE SAME

(71) Applicant: Winbond Electronics Corp., Taichung (TW)

(72) Inventor: Hiroki Murakami, Yokohama (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/689,055

(22) Filed: Apr. 17, 2015

(65) Prior Publication Data

US 2016/0071610 A1     Mar. 10, 2016

(30) Foreign Application Priority Data

Sep. 5, 2014   (JP) ................................. 2014-180764

(51) Int. Cl.
  *G11C 16/32*  (2006.01)
  *G11C 7/22*   (2006.01)
  *G11C 16/04*  (2006.01)

(52) U.S. Cl.
  CPC .............. *G11C 16/32* (2013.01); *G11C 7/222* (2013.01); *G11C 16/0483* (2013.01)

(58) Field of Classification Search
  CPC ......... G11C 16/32; G11C 7/22; G11C 7/222; G11C 8/18; G11C 16/0483
  See application file for complete search history.

(56) References Cited

U.S. PATENT DOCUMENTS

| 5,446,697 | A | * | 8/1995 | Yoo ........................ | H02M 3/07 365/189.07 |
| 5,633,825 | A | * | 5/1997 | Sakuta ................... | G11C 5/143 327/534 |
| 5,761,108 | A | * | 6/1998 | Martin ................... | G11C 5/145 365/149 |
| 6,249,445 | B1 | * | 6/2001 | Sugasawa ............. | H02M 3/073 307/110 |

(Continued)

FOREIGN PATENT DOCUMENTS

| JP | 2012190501 | 10/2012 |
| JP | 2013089138 | 5/2013 |

(Continued)

OTHER PUBLICATIONS

"Office Action of Korea Counterpart Application" with English translation, issued on May 27, 2016, p. 1-p. 7.

(Continued)

*Primary Examiner* — J. H. Hur
(74) *Attorney, Agent, or Firm* — Jianq Chyun IP Office

(57) ABSTRACT

A flash memory, a memory module, a computer-readable recording medium and an operating method are provided, which can perform a flexible setup by a flexible clock scheme. A NAND-type flash memory 100 of the invention includes: a memory array 110 having NAND-type memory cells, a controller 150 including a processor and a ROM/RAM, and a system clock generating circuit 200 configured to generate an internal system clock signal. The ROM/RAM is at least stored with setup commands for a setup of the flash memory, and the processor processes the setup commands based on the internal system clock signal during a setup period. The controller 150 further controls the system clock generating circuit 200, so that a frequency of the internal system clock signal becomes high speed during the setup period.

15 Claims, 8 Drawing Sheets

(56) References Cited

U.S. PATENT DOCUMENTS

| | | | | |
|---|---|---|---|---|
| 6,836,177 | B2 * | 12/2004 | Ito | G05F 1/468 327/536 |
| 6,891,426 | B2 * | 5/2005 | Zeng | H02M 3/073 327/415 |
| 7,251,162 | B2 * | 7/2007 | Kawajiri | G11C 16/12 365/185.18 |
| 8,350,616 | B1 * | 1/2013 | Fu | H02M 3/07 327/534 |
| 8,897,090 | B2 | 11/2014 | Oh | |
| 9,019,003 | B2 * | 4/2015 | Kim | G11C 7/12 327/536 |
| 2002/0131303 | A1 * | 9/2002 | Martines | G11C 16/30 365/185.18 |
| 2008/0136501 | A1 * | 6/2008 | Suzuki | G11C 5/143 327/536 |
| 2008/0137428 | A1 * | 6/2008 | Nakai | G11C 16/30 365/185.18 |
| 2013/0198589 | A1 * | 8/2013 | Choi | G06F 11/1072 714/773 |

FOREIGN PATENT DOCUMENTS

| | | |
|---|---|---|
| KR | 20030047794 | 6/2003 |
| KR | 20120030779 | 3/2012 |
| KR | 20120046204 | 5/2012 |

OTHER PUBLICATIONS

"Office Action of Taiwan Counterpart Application", issued on Jan. 20, 2016, p. 1-p. 11.

* cited by examiner

| | Erasing | Writing | Reading |
|---|---|---|---|
| Selected W/L | 0 | 15~20V | 0 |
| Non-seleted W/L | F | 10V | 4.5 |
| SGD | F | Vcc | 4.5 |
| SGS | F | 0 | 4.5 |
| SL | F | Vcc | 0 |
| P-well | 21 | 0 | 0 |

| Setup type | Value of multiplication |
|---|---|
| Setup 1 | n1 |
| Setup 2 | n2 |
| . . . | . . . |
| Setup i | ni |

FLEXIBLE CLOCK SCHEME OF FLASH MEMORY, MEMORY MODULE, COMPUTER-READABLE RECORDING MEDIUM AND OPERATING METHOD USING THE SAME

CROSS-REFERENCE TO RELATED APPLICATION

This application claims the priority benefit of Japan application serial no. 2014-180764, filed on Sep. 5, 2014. The entirety of the above-mentioned patent application is hereby incorporated by reference herein and made a part of this specification.

BACKGROUND OF THE INVENTION

1. Field of the Invention

The invention relates to a semiconductor memory device such as a NAND-type flash memory, and more particularly, relates to a flexible clock scheme used in the semiconductor memory device.

2. Description of Related Art

A flash memory is usually used as a memory medium for mobile equipments such as portable multifunction terminals (smart phones), tablet terminals and the like. In response to requirements for the mobile equipments in terms of low power consumption, the flash memory is also required to achieve low power consumption.

A flash memory disclosed in Patent Document 1 is capable of monitoring a power voltage came from the outside, and reducing a clock frequency for operating a charge pump in order to reduce power consumption when detecting that the power voltage is lower than a specific level. Further, a flash memory disclosed in Patent Document 2 is capable of stopping a clock of a state machine, which does not require a long period of operation, when operations such as erasing operations are performed for memory cells, such that power consumption may be further reduced.

PRIOR ART DOCUMENT

Patent Document

Patent Document 1: Japanese Patent Publication Number 2012-190501.
Patent Document 2: Japanese Patent Publication Number 2013-89138.

SUMMARY OF THE INVENTION

Problems to be Solved by the Invention

Unlike a NOR-type flash memory, a NAND-type flash memory is required to perform various complex operations. Therefore, a control based on a state machine is generally used in the NOR-type flash memory. Yet, the NAND-type flash memory uses a control of a processor capable of executing program data. The program data is stored in a read only memory (ROM) or a random access memory (RAM), so that the processor may execute the program data read from the ROM or the RAM in order to control operations of a memory array unit, a peripheral circuit, a voltage generating circuit, a data input/output and the like. However, the NAND-type flash memory can still perform processes based on the state machine.

The operations of the processor or the processes based on the state machine are usually performed in synchronization with a clock signal. That is, in the case of processes based on the processor, an increment is performed for an address of a program counter in synchronization with the clock signal, the program data is read one by one from the ROM/RAM, and then commands of the program data are decoded or processed; and in the case of the processes based on the state machine, predetermined operations are sequentially executed in synchronization with the clock signal. Accordingly, because a processing time of the processor or the state machine is depended upon a frequency of the clock signal, the processor or the state machine cannot execute the commands or execute the processes by using a speed higher than the frequency of the clock signal.

Generally, with respect to the NAND-type flash memory, a clock generator is provided therein so that an internal system clock signal may be generated based on the clock signal generated from the clock generator. Alternatively, in the NAND-type flash memory with other specifications, the clock signal may be received from the outside so that the external clock signal may be used to generate the internal system clock signal. A frequency of the internal system clock signal of the NAND-type flash memory takes in consideration of power consumption or signal integrity (noise) and is set in a manner of satisfying an internal minimum operating unit. That is, when the frequency of the clock signal is greater, power consumption as well as noise also becomes greater. Therefore, the clock frequency must be set in consideration of said factors.

FIG. 1 is a diagram illustrating an example of a processing sequence in a conventional NAND-type flash memory. In this example, a setup for operations is executed during a period T1; a voltage application for a cell array (e.g., reading, programming, erasing and verifying of data) is executed during a next period T2; a setup for verifying is executed during a next period T3; and verifying is executed during a next period T4. During the periods T1 to T4, the processor uses an internal system clock signal CLK to execute each of commands.

In the NAND-type flash memory, in order to perform the voltage application for a memory array, various voltages (e.g., a programming voltage Vpp, a reading voltage Vread, a passing voltage Vpass, selecting gate voltages VSGS and VSDG, etc.) need to be generated according to operations such as reading, programming, erasing, verifying and the like. Normally, the flash memory is provided with a voltage generating circuit including a charge pump circuit or a level shift circuit, and these circuits are used to convert a power voltage Vdd provided from an external power terminal into the required voltages. The example depicted in FIG. 1 shows an example as follows. In order to generate the voltages (Vpp, Vread, Vpass, VSGS, VSDG, etc.) required by the voltage application for the flash memory, commands for boosted voltages HV1, HV2, HV3, HV4 and HV5 are executed during each of the periods T1 and T3. Because the processor correspondingly executes 1 command per 1 clock, the processor requires 5 clocks in order to execute the 5 commands for HV1 to HV5.

During each of the periods T1 and T3, the processor executes the commands for HV1 to HV5, so as to generate high voltages required for the voltage application in the voltage generating circuit. However, in order to prevent the memory array from undesirable influences caused by the high voltages, the generated high voltages are electrically isolated from the cell array. When the period T1 ends, the processor, for example, executes commands equivalent to 5 clocks during the period T2, so as to control the operations of the flash memory, such as programming, reading, erasing and the like. During the next period T3, as similar to the period T1, the processor executes the commands for HV1 to HV5. When the period T3 ends, the processor, for example, executes commands equivalent to 5 clocks during the period T4, so as to control the operations such as verifying and the like.

A time of each of the setup periods T1 and T3 is proportional to a number of the commands processed by the processor, and when the number of the commands is greater, a number of the clocks is greater, the time of each of the periods T1 and T3 is longer, and an operating time of the flash memory is also longer. Therefore, it has been considered as to reduce the number of the commands by combining several commands during each of the setup periods T1 and T3. For example, as shown in FIG. 2, in the setup of period T1 and the setup of period T3, setup commands of HV1 and HV2 are combined and setup commands of HV3 and HV4 are combined. As such, the number of clocks in each of the periods T1 and T3 may be reduced to be 3, such that an overall number of clocks may be set to 16. In comparison with the situation in FIG. 1, each period is reduced by 4 clocks. On the other hand, it is required to prepare a combination of setup commands for combining HV1 and HV2, HV3 and HV4, HV2 and HV3, HV4, and HV5. Correspondingly, a decoding circuit becomes larger.

Accordingly, in the conventional NAND-type flash memory, the setup is lack of flexibility because the number of the commands that can be processed by the processor during the setup period are restricted by the frequency of the system clock signal.

The purpose of the invention aims to provide a semiconductor memory device capable of performing a flexible setup by a flexible clock scheme in order to solve aforesaid problems in the conventional art.

Technical Means for Solving the Problems

A NAND-type flash memory of the invention includes: a memory array, having NAND-type memory cells; a clock signal generating unit, generating a clock signal; an executing unit, receiving the clock signal generated by the clock signal generating unit, and executing predetermined processes of the flash memory in synchronization with the clock signal; and a controlling unit, controlling the clock signal generating unit during a setup period of the executing unit so that a frequency of the clock signal generated by the clock signal generating unit becomes high speed.

More preferably, the executing unit includes a storage unit, the storage unit stores commands for executing the predetermined processes of the flash memory, and the frequency of the clock signal becomes high speed during a period when the commands for the setup are executed by the executing unit. More preferably, the executing unit includes a state machine, the state machine executes the predetermined processes of the flash memory, and the frequency of the clock signal becomes high speed during a period when the processes for the setup are executed by the executing unit. More preferably, the controlling unit determines whether the setup is present based on an enable signal received from an external terminal. More preferably, the clock signal generating unit includes: a clock generator, generating the clock signal; multiple circuits, coupled to the clock generator and performing a multiplication for the clock signal; and a clock selecting circuit, coupled to the clock generator and the multiple circuits and selecting any one of the clock signal or the multiplied clock signal, the clock signal selected by the clock selecting circuit being provided to the executing unit, and the executing unit executing the processes based on the multiplied clock signal during the setup period. More preferably, the controlling unit sets a value of the multiplication performed by the multiple circuits for the clock signal, and outputs a control signal for controlling a selection of the clock selecting circuit to the clock signal generating unit. More preferably, the flash memory includes a voltage generating circuit, the voltage generating circuit generates a voltage based on a power voltage provided by an external terminal, and the executing unit makes the voltage generating circuit to generate a high voltage during the setup period. More preferably, the controlling unit includes a table for determining the values of the multiplications respectively corresponding to a plurality of the setups and an identifying unit for identifying the setup based on command data, and the controlling unit sets the value of the multiplication corresponding to the identified setup for the multiple circuits.

A computer-readable recording medium of the invention is used for a setup executed by a controller of a NAND-type flash memory, and the computer-readable recording medium includes the following steps: determining whether the setup is present; when determining that the setup is present, controlling a clock generating circuit so that an internal system clock signal becomes high speed only during a setup period; and making a processor to execute commands for the setup by using the high speed clock signal.

An operating method of the invention uses a clock signal in a NAND-type flash memory, and the operating method includes the following steps: determining whether a setup executed by a controller of the NAND-type flash memory is present; when determining that the setup is present, controlling a clock generating circuit so that an internal system clock signal becomes high speed only during a setup period; and making a processor to execute commands for the setup by using the high speed clock signal.

Effectiveness of the Invention

According to the invention, during the setup, the high speed clock signal may be used to execute the setup, and thus a number of processes that can be processed during the setup period may be properly set so that the setup can be more flexible. Further, as compared with the conventional art, under the circumstance where the number of the processes executed for the setup during the setup period remains the same, the time of the setup period may reduced to realize a reduction of a time for accessing the flash memory.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
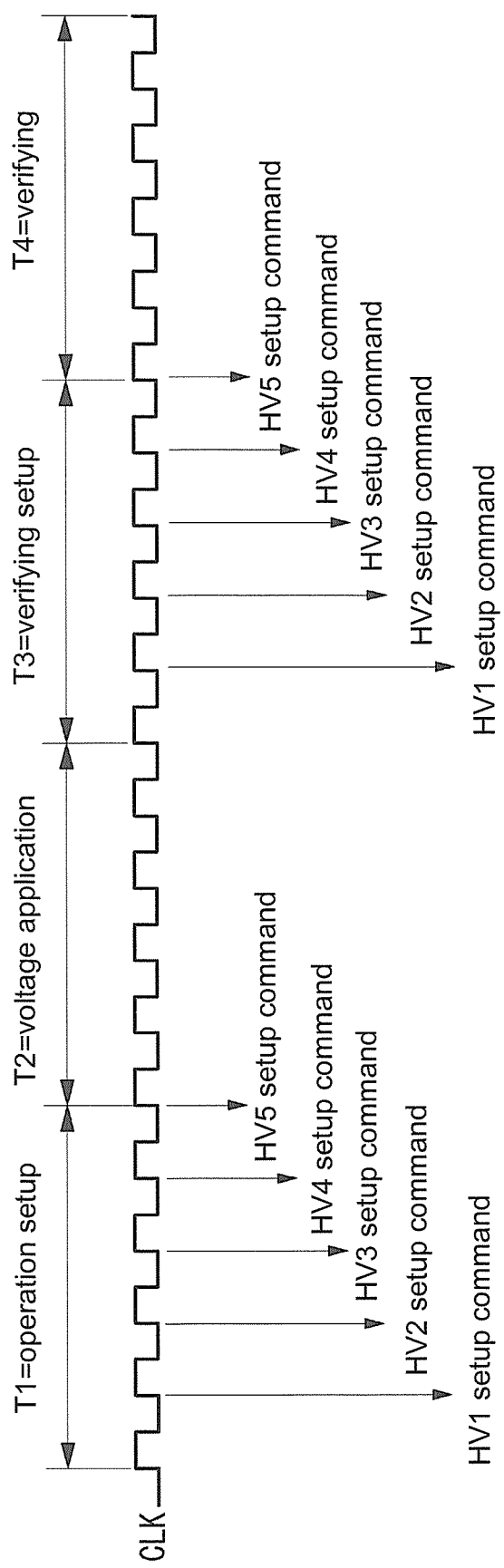
FIG. 1 is a diagram illustrating an example of a processing sequence in a conventional NAND-type flash memory.

Reference will now be made in detail to the present preferred embodiments of the invention, examples of which are illustrated in the accompanying drawings. Wherever possible, the same reference numbers are used in the drawings and the description to refer to the same or like parts.

Embodiments of the invention are described in detail below by reference with accompanied figures. In addition, it is worth to note that parts of the accompanied figures are exaggerated to emphasize on certain features to make it more apparent for understanding, and the proportion thereof is different from the real devices.

Figure 3:
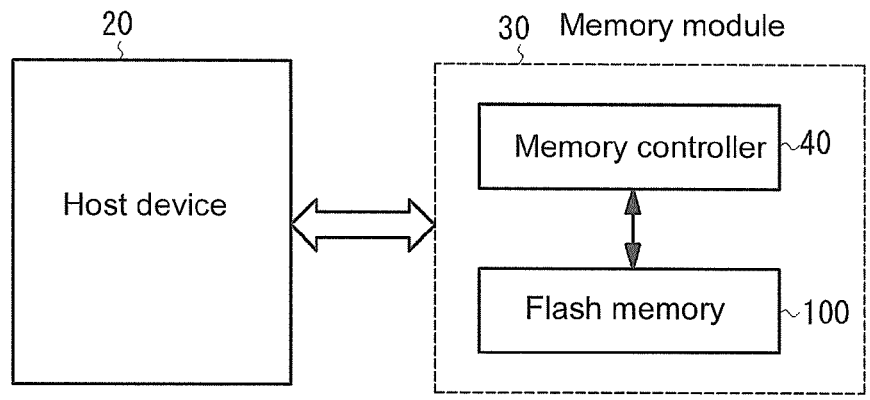
FIG. 3 is a diagram illustrating a structure example of a system according to an embodiment of the invention.

FIG. 3 is a diagram illustrating an example of a system of a flash memory according to an embodiment of the invention. A system 10 of the embodiment includes a host device 20 and a memory module 30 connected to the host device 20. The host device 20 may be an electronic device such as a computer, a digital camera, a printer and the like, or a chip disposed in a chip set, which are not particularly limited. The memory module 30 includes a memory controller 40 and a flash memory 100. The memory controller 40 controls, for example, a data transmission between the host device 20 and the flash memory 100.

Figure 4:
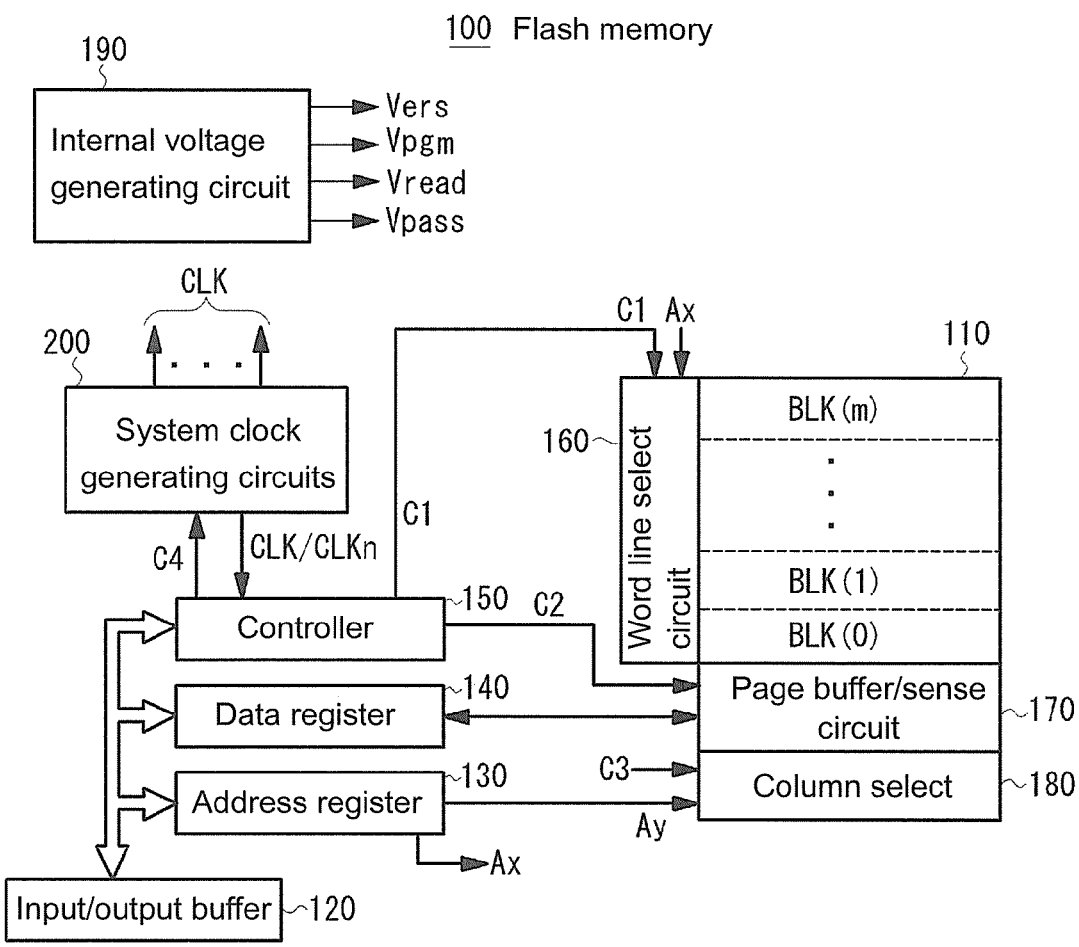
FIG. 4 is a block diagram illustrating a structure example of a NAND-type flash memory according to an embodiment of the invention.

A structure of a NAND-type flash memory 100 according to an embodiment of the invention is depicted in FIG. 4. As shown in FIG. 4, the flash memory 100 of the present embodiment includes: a memory array 110, in which a plurality of memory cells arranged in array are formed; an input/output buffer 120, connected to an external input/output terminal I/O, and retaining input/output data; an address register 130, receiving address data from the input/output buffer 120; a data register 140, retaining input/output data; a controller 150, generating control signals C1, C2, C3 and C4, and the control signals C1, C2, C3 and C4 controlling each part based on command data from the input/output buffer 120 and an external signal (e.g., a chip enable or an address latch enable, which are not illustrated); a word line select circuit 160, performing a decoding operation on row address information Ax from the address register 130, and performing a block selection and a word line selection based on a decoding result; a page buffer/sense circuit 170, retaining data read through the bit line, or retaining program data through the bit line; a column select circuit 180, performing a decoding operation for column address information Ay from the address register 130, and performing a bit line selection based on a decoding result; an internal voltage generating circuit 190, generating voltages required for reading, programming and erasing of data (e.g., a programming voltage Vpgm, a passing voltage Vpass, a reading voltage Vread, an erasing voltage Vers, etc.); and a system clock generating circuit 200, generating an internal system clock CLK.

Figures 5, 6:
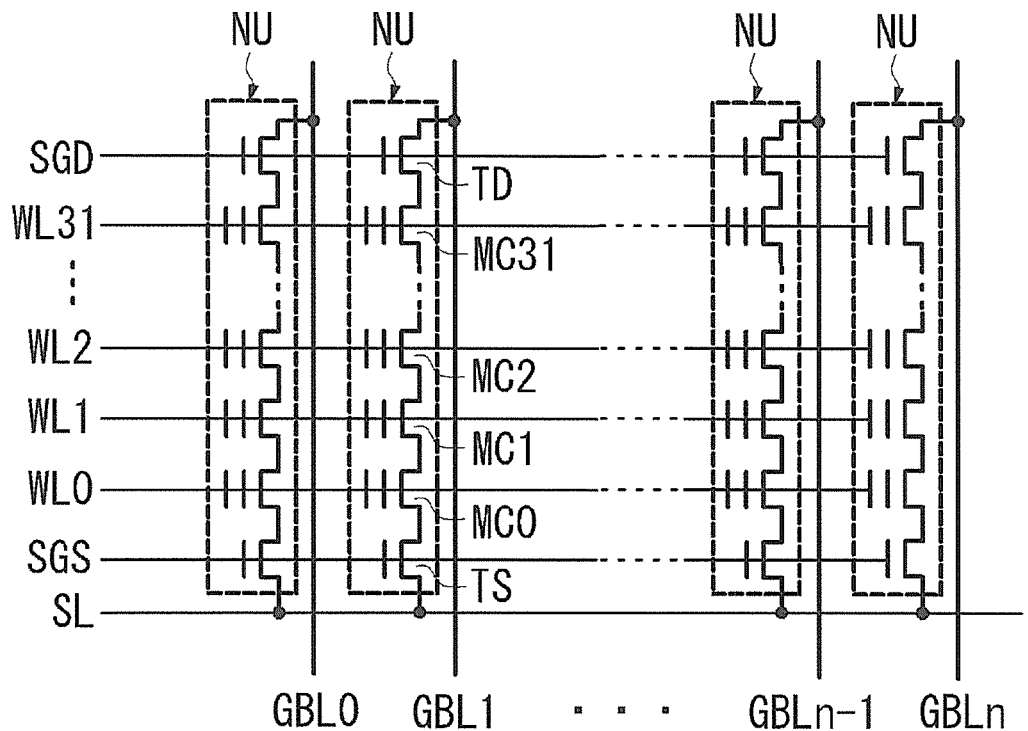
FIG. 5 is a circuit diagram illustrating a structure of a NAND string according to an embodiment of the invention.
FIG. 6 is a diagram illustrating an example of voltages applied to each part during operations of the flash memory according to an embodiment of the invention.

In one memory block, as shown in FIG. 5, includes a plurality of NAND strings NU formed by a plurality of memory cells connected in series, and an n+1 number of the NAND strings NU are arranged along row direction in one block. The NAND string NU includes: a plurality of memory cells MCi (i=0, 1, ..., 31) connected in series; a bit line select transistor TD, connected to a drain side of one end portion (i.e., the memory cell MC31); and a source line select transistor TS, connected to a source side of another end portion (i.e., the memory cell MC0). A drain of the bit line select transistor TD is connected to one corresponding bit line GBL, and a source of the source line select transistor TS is connected to a common source line SL.

Control gates of the memory cells MCi are connected to word lines WLi, gates of the select transistors TD and TS are connected to select gate lines SGD and SGS parallel to the word lines WL. When the word line select circuit 160 selects the blocks based on the row address Ax, the select transistors TD and TS are selectively driven by signals from the select gate lines SGS and SGD of the block.

The memory cell typically includes a MOS (Metal Oxide Semiconductor) structure, and the MOS structure includes: a source/drain, served as a N-type diffusion region and formed inside a P-well; a tunneling oxide film, formed on a channel between the source/drain; a floating gate (a charge accumulation layer), formed on the tunneling oxide film; and a control gate, interposed by a dielectric film to be formed on the floating gate. When the charges are not accumulated in the floating gate (i.e., when data "1" is written), a threshold is in a negative state, and the memory cells are normally on. When electrons are accumulated in the floating gate (i.e., when data "0" is written), the threshold shifts to a positive state, and the memory cells are normally off. The memory cells is not limited to only store one single bit but also store a plurality of bits.

FIG. 6 is a diagram illustrating a table of bias voltages applied during each operation of the flash memory. During a reading operation, a specific positive voltage is applied to the bit line; a specific voltage (e.g., 0 V) is applied to a selected word line; the passing voltage Vpass (e.g., 4.5 V) is applied to a non-selected word line; a positive voltage (4.5 V) is applied to the select gate lines SGD and SGS so that the bit line select transistor TD and the source line select transistor TS are turn on; and 0 V is applied to the common source line. During a programming (writing) operation, the programming voltage Vpgm (15 V to 20 V) of a high voltage is applied to the selected word line; a intermediate passing voltage (e.g., 10 V) is applied to the non-selected word line so that the bit line select transistor TD is turned on and the source line select transistor TS is turned off; and an electric potential corresponding to the data "0" or "1" is provided to the bit line GBL. During an erasing operation, 0 V is applied to the selected word line in the block, and the erasing voltage Vers (e.g., 20 V) of the high voltage is applied to the P-well to extract the electrons of the floating gate to a substrate, so as erase the data in blocks.

The internal voltage generating circuit 190 receives a power voltage Vdd provided from an external power terminal of the flash memory. The internal voltage generating circuit 190 includes a charge pump circuit or a level shift circuit, and operations of said circuits are under control by setup commands executed by the controller 150.

Figures 7, 8:
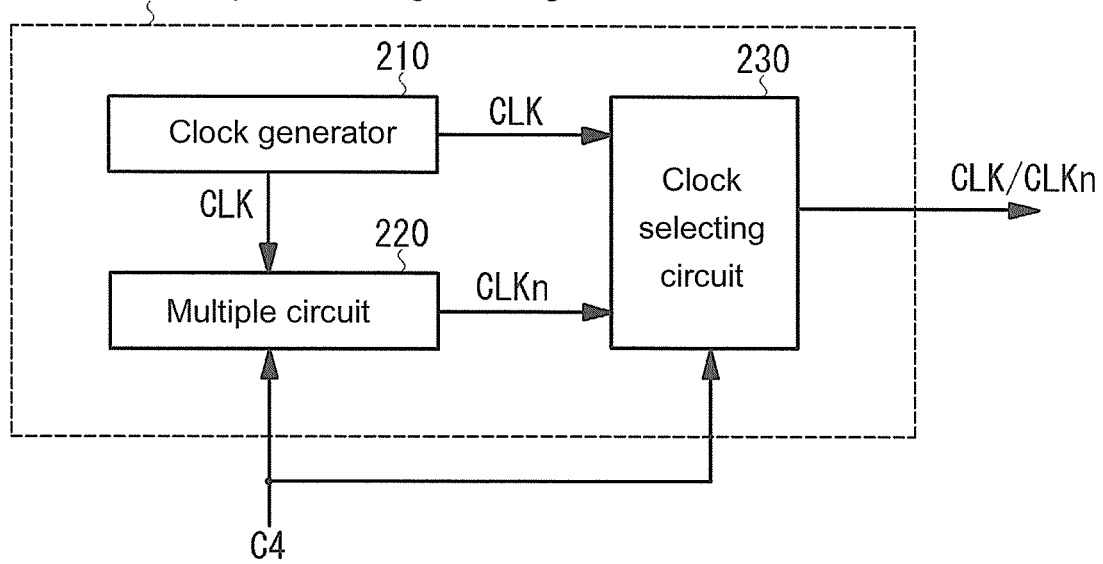
FIG. 7 is a diagram illustrating an inner structure of the system clock generating circuit according to an embodiment of the invention.
FIG. 8 is a diagram illustrating an example of a processing sequence according to an embodiment of the invention.

FIG. 7 is a diagram illustrating a structure example of the system clock generating circuit depicted in FIG. 4. The system clock generating circuit 200 includes: a clock generator 210, generating a clock signal CK having a frequency f; multiple circuits 220, performing a multiplication for the control signal CLK based on the control signal C4 from the controller 150 to generate a clock signal CLKn having a frequency of f×n (a period T/n); and a clock selecting circuit 230, receiving the clock signal CLK from the clock generator 210 and the clock signal CLKn from the multiple circuits 220, and selecting the clock signal CLK or the clock signal CLKn. The clock signal CLK/CLKn selected by the clock selecting circuit 230 is provided to the controller 150. Herein, it should be noted that, the providing of the clock signal is to the controller 150 is performed by the clock selecting circuit 230. In other words, a processor of the controller 150 executes the commands in synchronization with the clock signal CLK or the multiplied clock signal CLKn. Therefore, for other circuits excluding the controller 150, the clock signal CLK is constantly provided as the internal system clock signal.

The controller 150 is constituted by including the processor and a ROM and/or a RAM. The program data is stored in the ROM/RAM, such that the processor may read the program data from the ROM/RAM and execute the commands included in the program data. The processor receives the clock signal CLK/CLKn generated by the system clock generating circuit 200, and executes the commands one by one in synchronization with the clock signal CLK/CLKn.

When a specific operation is performed (i.e., when a setup is performed, which will be described later) by the flash memory 100, the controller 150 sets a value n of the multiplication for the multiple circuits 220, and outputs the control signal C4 (which controls the clock selecting circuit 230 to select the multiplied clock signal CLKn) to the system clock generating circuit 200. The value n of the multiplication may be, for example, a positive number greater than 1, which is not particularly limited. Further, the value n of the multiplication is not required to remain constant, and may be variable according to a setup type of the flash memory.

In a more preferable embodiment, the controller 150 determines whether a setup for the flash memory 100 is present. When it is determined that the setup is present, the multiple circuits 220 is controlled to multiple the frequency of the clock signal CLK to nf. Herein, the setup refers to processes required for operating the flash memory, which are operations not directly related to the operations of the memory array 110. More specifically, the setup refers to operations of the circuits to be electrically insulated from the memory array 110, such as a voltage generating operation of the internal voltage generating circuit 190. During this setup period, even if the commands based on the high speed clock signal CLKn is executed so that the internal voltage generating circuit 190 operates in high speed, the generated noise will not cause direct and undesirable influences to the data of the memory cell array.

In other more preferable embodiments, the controller 150 may have, for example, a table related to the value n of the multiplication according to the setup type included in the ROM/RAM. FIG. 8 is an example of said table. As shown in FIG. 8, the value of the multiplication is n1 if the setup type is 1, and the value of the multiplication is n2 if the setup type is 2. The controller 150 is capable of identifying the setup type based on an analyzed result of the commands received from the memory controller, and setting the value of the multiplication corresponding to the identified setup for the multiple circuits 220. Further, the clock selecting circuit 230 is also capable of selecting the clock signal CLKn of the multiple circuits 220 when the multiplied clock signal CLKn is received from the multiple circuits 220 regardless of the control signal C4 from the controller 150.

Figure 9:
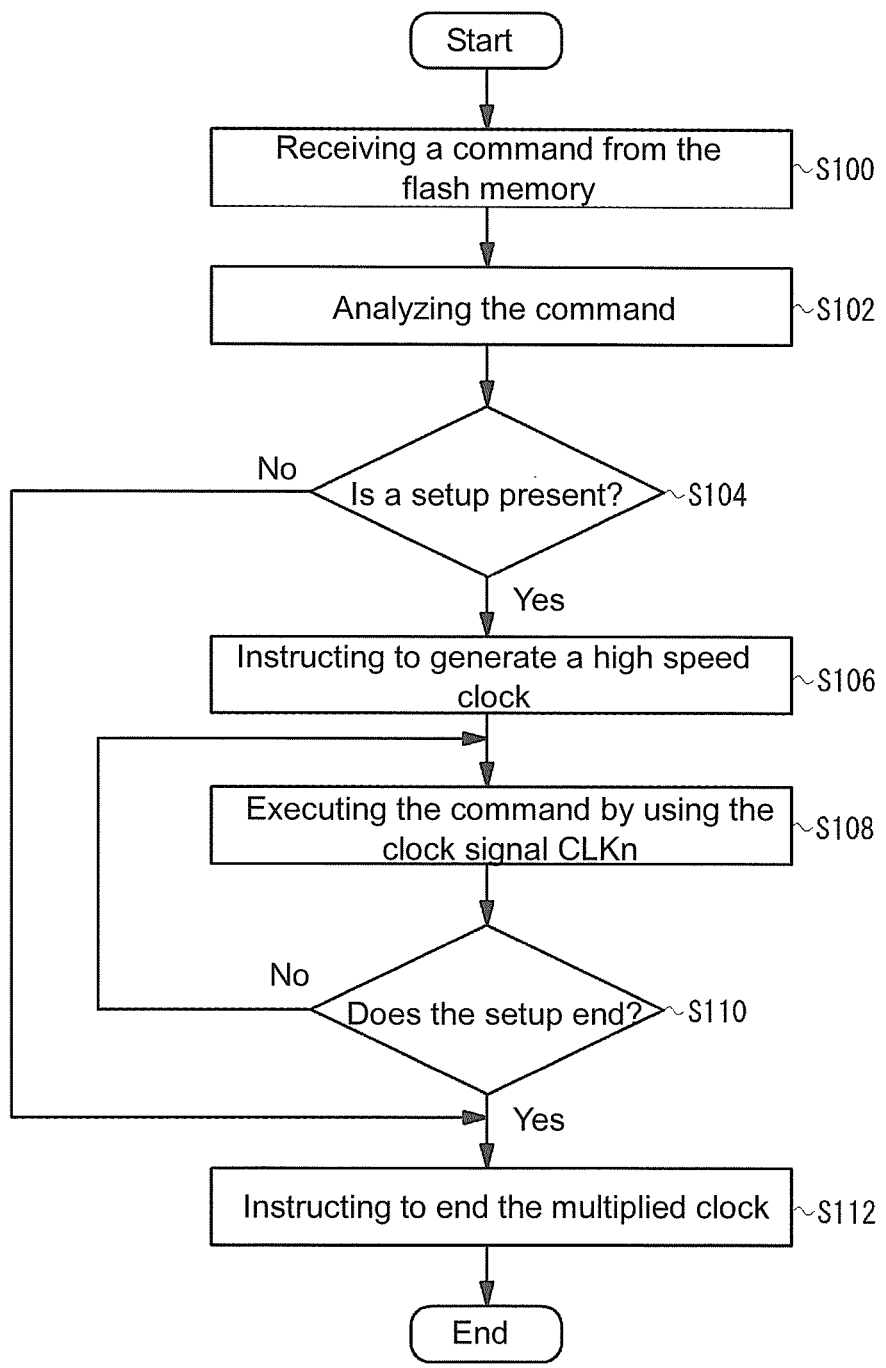
FIG. 9 is a flowchart illustrating the operations of the flash memory according to the first embodiment of the invention.

Next, the operations of the flash memory of the present embodiment are described with reference to the flowchart of FIG. 9. In the system 10 depicted in FIG. 3, the memory controller 40 sends a command to the flash memory 100 in response to a request from the host device 20. The command is received by the input-output buffer 120 of the flash memory 100 (S100). Subsequently, the received command is analyzed by the controller 150 (S102). The controller 150 determines whether a setup is generated based on an analyzed result of the command (S104). For example, when the command is a programming (writing) for the memory cells, the controller 150 determines that the setup is generated for generating the voltages required by the programming. Alternatively, when the command is a reading, a block-erasing, a verifying of the data, it is also determined that the setup is generated. However, whether to generate the setup may be properly selected according to operational specification of the flash memory 100.

When it is determined that the setup is generated, the controller 150 generates the control signal C4, and the control signal C4 instructs the system clock generating circuit 200 to generate a high speed clock (S106). Specifically, the controller 150 sets the value n of the multiplication for the multiple circuits 220, generates the clock signal CLKn multiplied by the multiple circuits 220, and makes the clock selecting circuit 230 to select the clock signal CLKn.

The clock selecting circuit 230 provides the multiplied clock signal CLKn to the controller 150, and the processor of the controller 150 uses the clock signal CLKn to execute the setup commands during the setup period (S108). The clock signal CLKn is only provided to the controller 150 by the clock selecting circuit 230 without being provided to the memory array 110. Therefore, the data of the memory cells may be prevented from the undesirable influences caused by high speed clock signal CLKn.

Next, the controller 150 determines whether setup ends (S112). For example, the controller 150 determines that the setup ends when the processes for all commands for the setup are completed. Alternatively, the controller 150 may count for a number of the clocks corresponding to a number of commands for the setup by adopt use of a counter or the like, such that it can be determined that the setup ends when a counted value reaches the number of the clocks.

When it is determined that the setup ends, the controller 150 instructs the system clock generating circuit 200 to end the multiplication for the clock signal (S112). Specifically, by using the control signal C4, the controller 150 may stop the operation of the multiple circuits 220 (or stop the multiplication), and make the clock selecting circuit 230 to select the clock signal CLK generated by the clock generator 210. As such, the normal system clock signal CLK may be provided to the controller 150.

Figure 2:
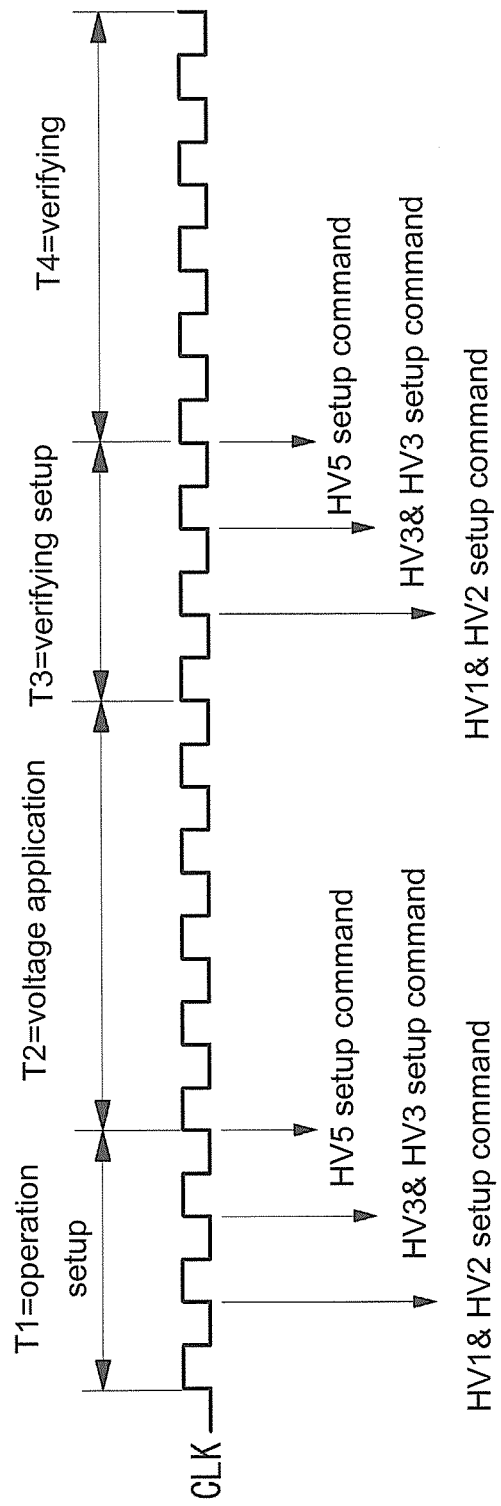
FIG. 2 is a diagram illustrating an example of a processing sequence in a conventional NAND-type flash memory.
Figure 10:
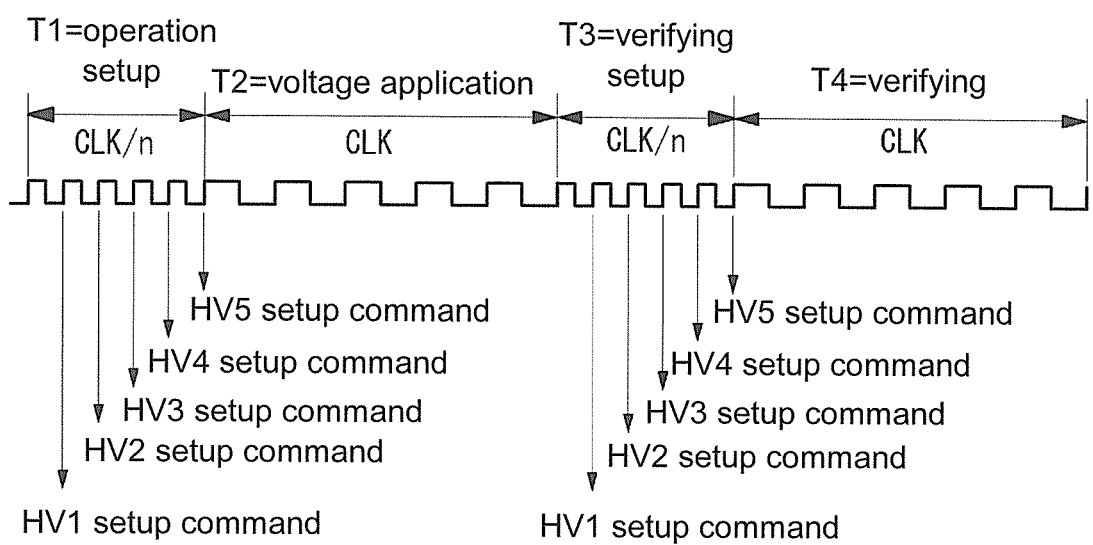
FIG. 10 is a diagram illustrating an example for setting the clock frequency according to an embodiment of the invention.

Next, a diagram illustrating an example of a processing sequence of the controller of the present embodiment is depicted in FIG. 10. In the processing sequence depicted in FIG. 10 that is corresponding to the processing sequences of FIG. 1 and FIG. 2, the controller 150 executes the setup during each of the periods T1 and T3 and executes the operations related to the memory cells during the period T2 and the period T4.

When the commands that should be implemented during the period T2 for the voltage application are received from the memory controller 40, the controller 150 determines that the setup is required and executes the processes for the setup during the period T1 before the period T2. As such, the controller 150 outputs the control signal C4 to the system clock generating circuit 200, and receives the multiplied clock signal CLKn from the system clock generating circuit 200. The controller 150 may identify the setup type during the period T1 and set the value of the multiplication corresponding to the setup type according to the table depicted in FIG. 8.

For example, if the controller 150 sets the value n of the multiplication to be 2, the clock signal CLKn having the frequency of 2f is generated and provided to the controller 150. Similarly, if n=3 (or n=4), the high speed clock signal CLKn of 3f (or 4f when n=4) is generated. During the setup period T1, the setup commands for the high voltages HV1 to HV5 are sequentially executed, but the setup period T1 may be reduced because the clock signal CLKn is in higher speed than the clock signal CLK. On the other hand, if the setup period T1 is recognized as having the same time of the setup period T1 in FIG. 1, a number of the commands that can be executed in the present embodiment is greater than the number of the commands that can be executed in the setup period T1 in FIG. 1. Further, the clock signal CLKn generated during the setup period T1 is only provided to the controller 150, such that the data stored in the memory cell or the signal integrity may be prevented from the undesirable influences.

When the setup period T1 ends, during the period T2 for the voltage application, the normal internal system clock signal CLK may be provided to the controller 150. The controller 150 executes the commands required in the voltage application during the period T2 based on the clock signal CLK.

Next, when the command for the verifying is received, the controller 150 determines that the setup for the verifying is required and controls the system clock generating circuit 200 during the setup period T3 to provide the multiplied clock signal CLKn. When the setup ends, the system clock generating circuit 200 is controlled again to provide the normal internal system clock signal CLK. In the processing sequence of FIG. 10, when the multiplication is performed for the clock signal CLK in the condition where n=2 (the frequency=2×f, the period=½T), a total of 20 clocks are required in FIG. 1. On the other hand, in the present embodiment, if the system clock before the multiplication is taken for calculation, only a total of 15 clocks are required.

As such, according to the present embodiment, during the setup period, because the clock frequency used for the processes of the processor is in higher speed than the normal internal system clock frequency, a content of the setup may be set with more flexibility. Meanwhile, by making the setup period shorter than the setup period in the conventional art, the flash memory may operate in high speed.

Next, a second embodiment of the invention is described below. The first embodiment shows the example in which the controller 150 makes the clock signal to become high speed during the setup period according to the commands from the memory controller. In the second embodiment, the controller 150 makes the clock signal to become high speed during the setup period according to an external control signal from the memory controller.

Figure 11:
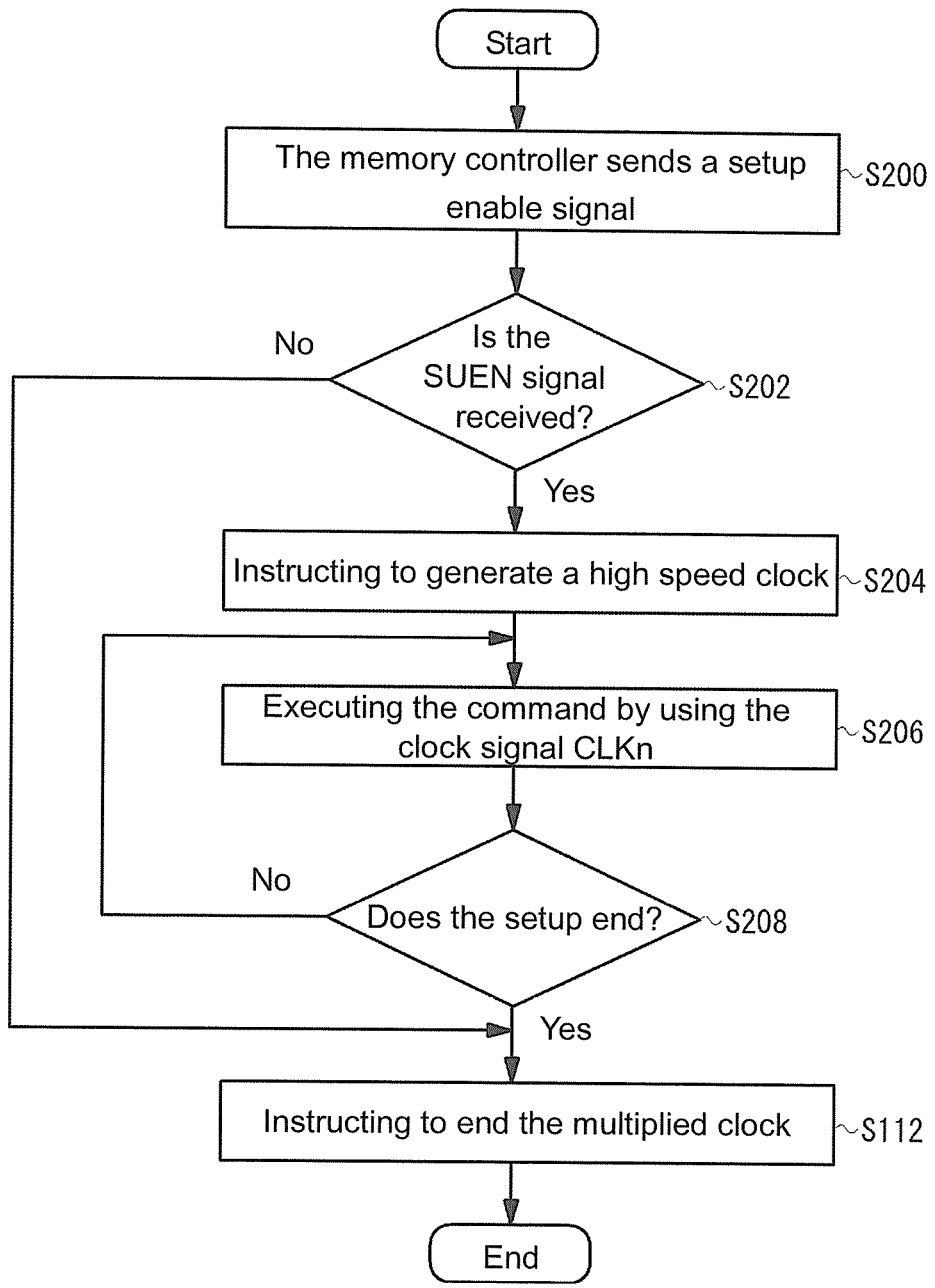
FIG. 11 is a flowchart illustrating the operations of the flash memory according to the second embodiment of the invention.

FIG. 11 is a flowchart illustrating operations of the second embodiment. The memory controller 40 sends a setup enable signal (served as the external control signal) to the flash memory 100 (S200). The controller 150 determines whether the setup enable signal is received from an external control terminal (S202). When it is determined that the setup enable signal is received, as similar to the first embodiment, the controller 150 uses the control signal C4 to control the system clock control circuit 200 for generating the high speed clock signal (S204), and the controller 150 then executes the setup commands according to the generated clock signal CLKn (S206).

Next, the controller 150 determines whether setup ends (S208). A determining method of the above is similar to that in the first embodiment, that is, it is determined that the setup ends when all of the setup commands are executed or when the number of the clocks passed is identical to the number of the commands for the setup. Further, in other methods, the controller 150 may also determine that the setup ends in response to a setup disable signal for ending the setup which is received from the memory controller 40. At this time, the memory controller 40 and the flash memory 100 are synchronously operated by commonly using the external system clock, and the memory controller 40 may also monitor a setup time based on the number of the clocks or a time of the internal system clock signal synchronized with the external system clock signal.

In the foregoing embodiments, although the system clock generating circuit 200 depicted in FIG. 7 uses the multiple circuits 220 to perform the multiplication for the clock signal CLK which is from the clock generator 210, it is merely an example. The system clock generating circuit 200 of the present embodiment is not limited by such structure, and the clock frequency may become any frequency. For example, the system clock generating circuit 200 may also include a PLL circuit, and the PLL circuit may make a clock from a crystal oscillator (which generates a reference clock) to become the required frequency clock. More preferably, in response to the control signal C4 from the controller 150, the PLL circuit may output a clock signal that makes a frequency of the reference clock to be variable in high speed only during the setup period, and output the clock of the normal frequency during the period for the voltage application. In this case, the system clock generating circuit does not require use of the clock selecting circuit 230 depicted in FIG. 7. Further, it is possible that the system clock generating circuit of the present embodiment does not adopt use of the PLL, and instead, one or more voltage-dividing circuits or multiple circuits are properly combined to generate the clock signal having the required voltage.

Furthermore, although the foregoing embodiments show the examples in which the NAND-type flash memory executes the commands by using the processor, but the invention is not limited thereto. It is also possible that the NAND-type flash memory of the invention does not use the processor but use a state machine capable of executing a predetermined processing sequence in synchronization with the clock signal. In the case of the state machine, when each of the processes corresponding to the predetermined setup period is executed, the high speed processing may be realized by performing the multiplication for the clock. For example, in the case of the processes depicted in FIG. 10, the multiplied clock is used for each of the processes of each of the setup periods T1 and T3, and the multiplied clock is restored when it is detected that the each of the setup periods T1 and T3 ends. For example, the system clock generating circuit depicted in FIG. 7 detects each of the setup periods T1 and T3 based on the content processed by the state machine, and the multiplied clock is generated in this period. Accordingly, even in the case of the processes based on the state machine, reduction of the setup time may also be realized by using the high speed clock during the setup period.

The preferable embodiment of the invention had been described in detail above, but the invention is not limited to a specific embodiment. It will be apparent to those skilled in the art that various modifications and variations can be made to the structure of the present invention without departing from the scope or spirit of the invention.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flash memory, being a NAND-type ash memory, and comprising:
   a memory array, having a plurality of NAND-type memory cells;
   a clock signal generating unit, generating a clock signal;
   an executing unit, receiving the clock signal generated by the clock signal generating unit, and executing predetermined processes of the flash memory in synchronization with the clock signal; and
   a controlling unit, controlling the clock signal generating unit to generate the clock signal with a first frequency only during a setup period of the executing unit, and generate the clock signal with a second frequency outside the setup period of the executing unit, wherein the first frequency is greater than the second frequency and wherein a plurality of high voltages required for operating the flash memory are generated only during the setup period.

2. The flash memory according to claim 1, wherein the executing unit comprises a storage unit, wherein the storage unit stores commands for executing the predetermined processes of the flash memory, and the clock signal has the first frequency during a period when commands for a setup are executed by the executing unit.

3. The flash memory according to claim 1, wherein the executing unit comprises a state machine, wherein the state machine executes the predetermined processes of the flash memory, and the clock signal has the first frequency during a period when processes for a setup are executed by the executing unit.

4. The flash memory according to claim 1, wherein the controlling unit determines whether a setup is present based on an enable signal received from an external terminal.

5. The flash memory according to claim 1, wherein
   the clock signal generating unit comprises: a clock generator, generating the clock signal; multiple circuits, coupled to the clock generator and performing a multiplication for the clock signal; and a clock selecting circuit, coupled to the clock generator and the multiple circuits and selecting any one of the clock signal or a multiplied clock signal, and
   the clock signal selected by the clock selecting circuit is provided to the executing unit, and
   the executing unit executes processes based on the multiplied clock signal during the setup period.

6. The flash memory according to claim 5, wherein the controlling unit sets a value of the multiplication performed by the multiple circuits for the clock signal, and outputs a control signal for controlling a selection of the clock selecting circuit to the clock signal generating unit.

7. The flash memory according to claim 1, wherein the flash memory comprises a voltage generating circuit, wherein the voltage generating circuit generates a voltage based on a power voltage provided by an external terminal, and the executing unit makes the voltage generating circuit to generate the plurality of high voltages during the setup period.

8. The flash memory according to claim 6, wherein the controlling unit comprises a table for determining the values of the multiplications respectively corresponding to a plurality of the setups and an identifying unit for identifying the setup based on command data, and the controlling unit sets the value of the multiplication corresponding to an identified setup for the multiple circuits.

9. A memory module, comprising:
   the flash memory according to claim 8; and
   a memory controller, coupled to the flash memory,
   wherein the memory controller sends the command data or an enable signal to the flash memory.

10. A non-transitory computer-readable recording medium configured to store a computer program, for a setup of a NAND-type flash memory, which is loaded in a controller to execute following steps:
    determining whether the setup is present;
    when determining that the setup is present, controlling a clock generating circuit to generate an internal system clock signal with a first frequency only during a setup period, and generate the internal system clock signal with a second frequency outside the setup period, wherein the first frequency is greater than the second frequency and wherein a plurality of high voltages required for operating the flash memory are generated only during the setup period; and
    making a processor to execute commands for the setup by using the internal system clock signal with the first frequency.

11. The non-transitory computer-readable recording medium according to claim 10, wherein the step of determining whether the setup is present is performed based on an external enable signal received from a memory controller.

12. The non-transitory computer-readable recording medium according to claim 10, wherein the clock generating circuit comprises multiple circuits and a clock selecting circuit, and the step of controlling the clock generating circuit comprises setting a value of a multiplication of the multiple circuits, and controlling the clock selecting circuit to provide the multiplied clock signal to the processor.

13. The non-transitory computer-readable recording medium according to claim 10, wherein during the setup period, the commands for the setup are executed to generate the plurality of high voltages required for operating the flash memory.

14. An operating method, using a clock signal in a NAND-type flash memory, and the operating method comprising steps of:
    determining whether a setup executed by a controller of the NAND-type flash memory is present;
    when determining that the setup is present, controlling a clock generating circuit to generate an internal system clock signal with a first frequency only during a setup period, and generate the internal system clock signal with a second frequency outside the setup period, wherein the first frequency is greater than the second frequency and wherein a plurality of high voltages required for operating the flash memory are generated only during the setup period; and making a processor to execute commands for the setup by using the internal system clock signal with the first frequency.

15. The operating method according to claim 14, wherein the clock generating circuit comprises multiple circuits and a clock selecting circuit, and the step of controlling the clock generating circuit comprises setting a value of a multiplication of the multiple circuits, and controlling the clock selecting circuit to provide the multiplied clock signal to the processor.

\* \* \* \* \*